United States Patent
Zeller

(10) Patent No.: US 8,248,123 B2
(45) Date of Patent: Aug. 21, 2012

(54) LOOP FILTER

(75) Inventor: Sebastian Zeller, Grassbrunn (DE)

(73) Assignee: STMicroelectronics Design & Application GmbH, Grassbrunn (DE)

( * ) Notice: Subject to any disclaimer, the term of this patent is extended or adjusted under 35 U.S.C. 154(b) by 338 days.

(21) Appl. No.: 12/608,788

(22) Filed: Oct. 29, 2009

(65) Prior Publication Data

US 2011/0102032 A1 May 5, 2011

(51) Int. Cl.
*H03L 7/06* (2006.01)
*H03K 5/00* (2006.01)

(52) U.S. Cl. ........ 327/157; 327/147; 327/148; 327/156; 327/558; 331/17

(58) Field of Classification Search .................. 327/147, 327/148, 156, 157, 551–559; 331/17
See application file for complete search history.

(56) References Cited

U.S. PATENT DOCUMENTS

| | | | | |
|---|---|---|---|---|
| 4,559,505 A | * | 12/1985 | Suarez et al. | 331/1 A |
| 5,055,803 A | * | 10/1991 | Hietala | 331/17 |
| 7,292,077 B2 | * | 11/2007 | Liu | 327/156 |
| 7,498,888 B2 | * | 3/2009 | Nitsche et al. | 331/17 |
| 7,750,731 B2 | * | 7/2010 | Poulsen et al. | 330/10 |
| 7,880,516 B2 | * | 2/2011 | Beaulaton et al. | 327/156 |
| 2006/0139109 A1 | * | 6/2006 | Oustaloup et al. | 331/17 |
| 2008/0191759 A1 | * | 8/2008 | Neurauter et al. | 327/157 |

* cited by examiner

*Primary Examiner* — Patrick O'Neill
(74) *Attorney, Agent, or Firm* — Seed IP Law Group PLLC

(57) ABSTRACT

A loop filter having a first node on which to receive an input signal to the loop filter, a second node on which to provide an output signal of the loop filter, and a cascade arrangement of at least a first circuit that generates a zero, a second circuit that generates a first pole, and a third circuit that generates a second pole to form a passive loop filter of at least 3rd order. The cascade arrangement includes a first signal path coupling the first node to the second node, such that the first circuit is coupled to the first node through the second circuit and the third circuit. Further, the loop filter includes at least one transistor circuit, and a second signal path coupled in parallel to the first signal path at the first node and coupled to the second node through the transistor circuit.

31 Claims, 4 Drawing Sheets

Pull-in transient of a PLL with the proposed 3rd order loop filter and an equivalent standard 3rd order loop filter

LOOP FILTER

BACKGROUND

1. Technical Field

This disclosure pertains to a loop filter and, more particularly, to a high ohmic loop filter with reduced noise that also facilitates IC integration comprising a first node for providing an input signal to the loop filter and a second node for providing an output signal for the loop filter, and further comprising a cascade arrangement of at least a first circuit for generating a zero, a second circuit for generating a first pole and a third circuit for generating a second pole to form a passive loop filter of at least third order. The cascade arrangement includes at least one signal path coupled between the first node and the second node. Such loop filter may be applied, for example, in a phase locked loop which may be applied in a frequency synthesizer, for example in communication or entertainment applications such as radio frequency tuners.

2. Description of the Related Art

Frequency synthesizers may be employed in communication or entertainment applications such as in receivers of radio frequency tuners for receiving and tuning broadcasting signals. A frequency synthesizer of such a system may include a phase locked loop (PLL) having an oscillator, such as a voltage-controlled oscillator, a loop filter, and a phase-frequency detector. The phase-frequency detector compares the phase and frequency of a periodic input signal against the phase and frequency of the oscillator. The output of the phase-frequency detector is a measure of the phase and frequency difference between the two inputs. Control signals from the phase-frequency detector are supplied to a charge pump, which generates a control signal (e.g., a current signal) that is low-pass filtered by a loop filter and then provided to the voltage-controlled oscillator. The voltage-controlled oscillator (VCO) generates the output signal of the PLL. This output signal can be used, for example, as local oscillator signal for a receiver mixer of a receiver chain in a tuner for radio frequency signals. As the VCO is driven by the loop filter, the loop filter determines loop characteristics of the PLL, such as the settling time and loop stability.

One approach that has been used for implementing a loop filter is shown in FIG. 1. The loop filter according to FIG. 1 is of third order, i.e., it includes a third order transfer function. The third order passive loop filter according to FIG. 1 includes a first node 1 for providing an input signal to the loop filter. For example, the input signal may be a current $I_{CP}$ provided by a charge pump of a PLL. The loop filter further includes a second node 2 for providing an output signal of the loop filter, which may be a control voltage $V_{TUNE}$ provided to a voltage-controlled oscillator of a PLL. For realizing the transfer function the loop filter further includes a cascade arrangement of RC-sections having a capacitor $C_1$ and resistor $R_2$ for generating a zero in the transfer function, a capacitor $C_2$ and resistor $R_2$ for generating a first pole, and a capacitor $C_3$ and a resistor $R_3$ for generating a second pole in the transfer function to form a passive loop filter of third order. The cascade arrangement is coupled in a signal path 3 between the first node 1 and the second node 2. The third order passive loop filter according to FIG. 1, therefore, includes in first order approximation an integrator with zero $1/(C_1 R_2)$, a first pole $1/(C_2 R_2)$, and a second pole $1/(C_3 R_3)$.

According to FIG. 2, another approach of a loop filter that has been used is shown. In FIG. 2, the circuit structure according to FIG. 1 is extended to form a passive loop filter of N-th order by adding additional poles with additional RC-sections $C_4$, $R_4$ up to $C_N$, $R_N$ in the cascade arrangement between first node 1 for receiving the input signal 6 and node 2 for providing the output signal $V_{TUNE}$. For optimum steepness of the filter slope, loading of the k−1-th pole by the input impedance of the k-th pole with k=2 … N−1 must be avoided. Therefore, the condition $1 \ll (R_k/R_{k-1})+(C_{k-1}/C_k)$ with k=3 … N must be fulfilled. When applied in a PLL, the charge pump current $I_{CP}$ and the loop filter impedance are usually chosen such that the noise contribution of the resistors $R_2, \ldots, R_N$ is acceptable. Hence, usually the higher the loop filter order is, the lower the loop filter impedance and the higher the charge pump current must be. Furthermore, the value of $C_N$ must be much larger than the input capacitance of the VCO, which can be quite large, to obtain a well controlled transfer function of the loop filter. During the so called pull-in transient time (which is determining the settling time of the loop filter until all capacitors are charged and stationary conditions of the loop filter are reached) the output signal $V_{TUNE}$ is slew rate limited (which is approximately $I_{CP}/2C_1$ as usually capacitor $C_1$ is significantly greater than the other capacitors, i.e., $C_1 \gg C_2 \ldots C_N$).

BRIEF SUMMARY

This disclosure pertains to a loop filter and, more particularly, to a high ohmic loop filter with reduced noise that also facilitates IC integration. The filter includes a first node for providing an input signal to the loop filter and a second node for providing an output signal for the loop filter, and further includes a cascade arrangement of at least a first circuit for generating a zero, a second circuit for generating a first pole and a third circuit for generating a second pole to form a passive loop filter of at least third order. The cascade arrangement includes at least one signal path coupled between the first node and the second node. Such loop filter may be applied, for example, in a phase locked loop which may be applied in a frequency synthesizer, for example in communication or entertainment applications such as radio frequency tuners.

According to an aspect, an embodiment of a loop filter includes a first node to provide an input signal of the loop filter and a second node to provide an output signal of the loop filter, and further includes a cascade arrangement of at least a first circuit to generate a zero, a second circuit to generate a first pole, and a third circuit to generate a second pole to form a passive loop filter of at least third order, the cascade arrangement having a first signal path coupled between the first node and the second node. The cascade arrangement is coupled between the first node and the second node such that the first circuit is coupled to the first node through the second circuit and the third circuit. The loop filter further includes at least one transistor circuit, and a second signal path coupled in parallel to the first signal path at the first node and coupled to the second node through the transistor circuit.

Accordingly, in an improved loop filter structure which may be, in principle, of N-th order, the approach that has been used previously, such as shown in FIGS. 1 and 2, is reversed, i.e., the circuit generating a zero is coupled closer to the output node, and on the other hand, the circuit generating the highest pole is coupled closer to the input node than to the output node of the loop filter. The loop filter transfer function $V_{TUNE}/I_{CT}$ is unchanged, but the noise contribution of the resistors $R_3, \ldots R_N$ to the phase noise of the PLL is reduced significantly. Hence, the loop filter can be made more high ohmic, which helps for IC integration as the capacitors can be made smaller. In a further aspect, the loop filter includes at least one transistor circuit, and a second signal path coupled in parallel to the first signal path at the first node and coupled to the second node through the transistor circuit. The transistor circuit and the second signal path may serve to reduce a lock time of the PLL.

In accordance with another aspect of the present disclosure, a circuit is provided that includes a loop filter, the loop filter including a first node to receive an input signal to the loop filter and a second node to provide an output signal of the loop filter; a first resistor and first capacitor series coupled between the second node and a reference node; a first circuit to generate a first pole, the first circuit comprising a second capacitor coupled between the second node and the reference node and the first resistor; and a second circuit for generating a second pole including a second resistor having a first terminal coupled to the second node and a second terminal coupled to a first terminal of a third capacitor, the third capacitor having a second terminal coupled to the reference node, and the second terminal of the second resistor coupled to the first node.

In accordance with another aspect of the present disclosure, the circuit includes at least one transistor circuit having first and second transistors, each transistor having a gate terminal coupled to the first node and a conduction terminal coupled to a first terminal of a fourth transistor that has its second terminal coupled to the second node, and a first one of the two transistors having a second conduction terminal coupled to a voltage source and the other one of the pair of transistors having a second conduction terminal coupled to the reference node.

In accordance with another aspect of the present disclosure, the foregoing circuit further includes a charge pump having an input coupled to the second node of the loop filter and first and second outputs coupled to first and second inputs of a phase detector circuit that has a first output coupled to an input of a divider that has an output coupled to an input of a voltage controlled oscillator that has an output coupled to the first node of the loop filter.

BRIEF DESCRIPTION OF THE SEVERAL VIEWS OF THE DRAWINGS

Aspects and embodiments of the disclosure will now be described with reference to the drawings, in which.

DETAILED DESCRIPTION

Figure 3:
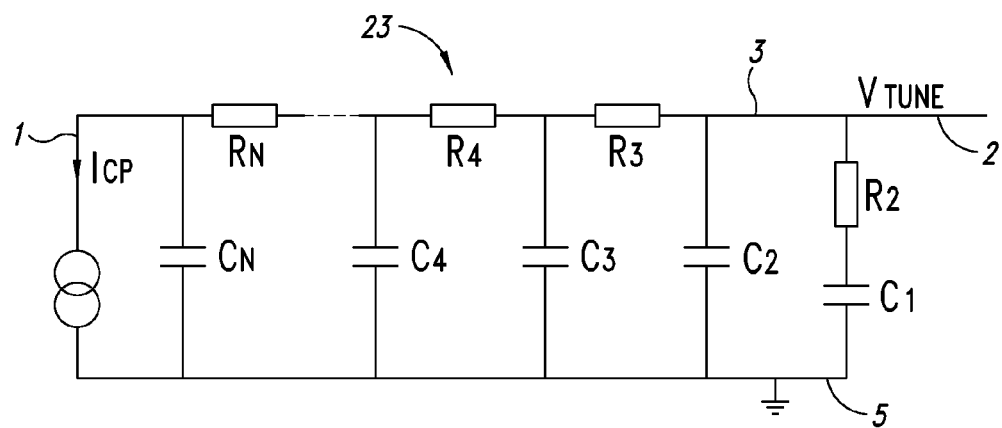
FIG. 3 shows a first embodiment of a loop filter.

In FIG. 3, there is shown an exemplary embodiment of a loop filter. The loop filter of FIG. 3 includes a first node 1 for providing an input signal $I_{CP}$ to the loop filter, such as an input current signal $I_{CP}$ provided by a charge pump when the loop filter is applied in a PLL structure, for example. The loop filter further includes a second node 2 for providing an output signal $V_{TUNE}$ of the loop filter, which may be a tuning voltage for a voltage controlled oscillator of a PLL.

A cascade arrangement of circuits for providing the desired transfer function of the loop filter includes a first signal path 3 coupled between nodes 1 and 2. In the embodiment of FIG. 3, the loop filter is formed by the cascade arrangement of at least a first circuit for generating a zero in the transfer function, a second circuit for generating a first pole and a third circuit for generating a second pole in the transfer function to form a passive loop filter of third order. Particularly, the first circuit for generating a zero includes at least a first resistor $R_2$ and a first capacitor $C_1$ which are coupled in series between the second node 2 and the reference node 5 which may be coupled to ground. The second circuit for generating a first pole is coupled to the signal path 3 and includes at least a second capacitor $C_2$ coupled between the signal path 3 and the reference node 5. In the present embodiment, the first pole is generated by the circuit of capacitor $C_2$ and resistor $R_2$, the latter being particularly provided for stability reasons of the loop filter. The third circuit for generating a second pole is coupled in the signal path 3 and includes a third resistor $R_3$ and a third capacitor $C_3$, with the third capacitor $C_3$ coupled between the signal path 3 and the reference node 5 and the third resistor $R_3$ coupled in the signal path 3. Further, a fourth circuit for generating a third pole is coupled in the signal path 3 and includes a fourth resistor $R_4$ and a fourth capacitor $C_4$, with the capacitor $C_4$ coupled between the signal path 3 and the reference node 5 and the resistor $R_4$ coupled in the signal path 3 between the third circuit comprising capacitor $C_3$ and resistor $R_3$, and the first node 1.

In this way, the loop filter according to FIG. 3 may be extended to N-th order by adding additional poles formed by a respective circuit up to an N-th circuit coupled in the signal path 3 which includes at least a resistor $R_N$ and a capacitor $C_N$. The capacitor $C_N$ is coupled between the signal path 3 and the reference node 5, and the resistor $R_N$ is coupled in the signal path 3 between the circuits for generating the other (lower) poles and the first node 1.

In an embodiment, in a third order loop filter, the second circuit comprising capacitor $C_2$ and resistor $R_2$, and the third circuit comprising capacitor $C_3$ and resistor $R_3$ are configured such that the input impedance of the second pole is higher than the output impedance of the first pole. In other words, the impedance of the poles increases with the order, i.e., $1 \ll (R_k/R_{k-1}) + (C_{k-1}/C_k)$ with $k=3 \ldots N$. Further, according to an embodiment the impedance of the circuit comprising capacitor $C_1$ and resistor $R_2$ for generating a zero is lower than the impedance of the circuits for generating the poles. For example, the capacitance of capacitor $C_1$ is higher than the capacitance of the capacitors $C_2$ up to $C_N$, wherein it may be that $C_1 \gg C_2, \ldots, C_N$.

Figure 1:
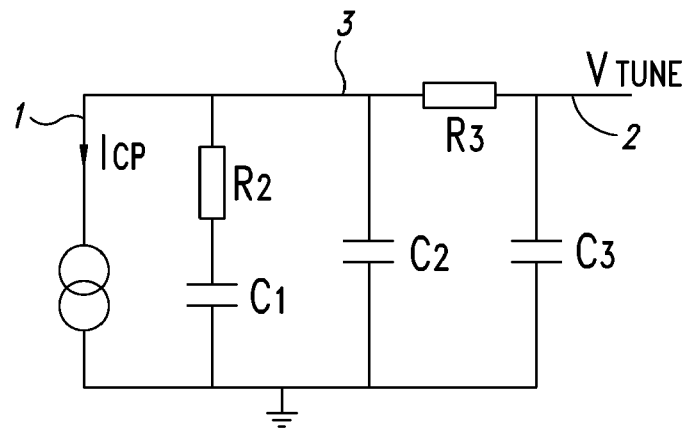
FIG. 1 shows a loop filter structure according to one approach that has been used.
Figure 2:
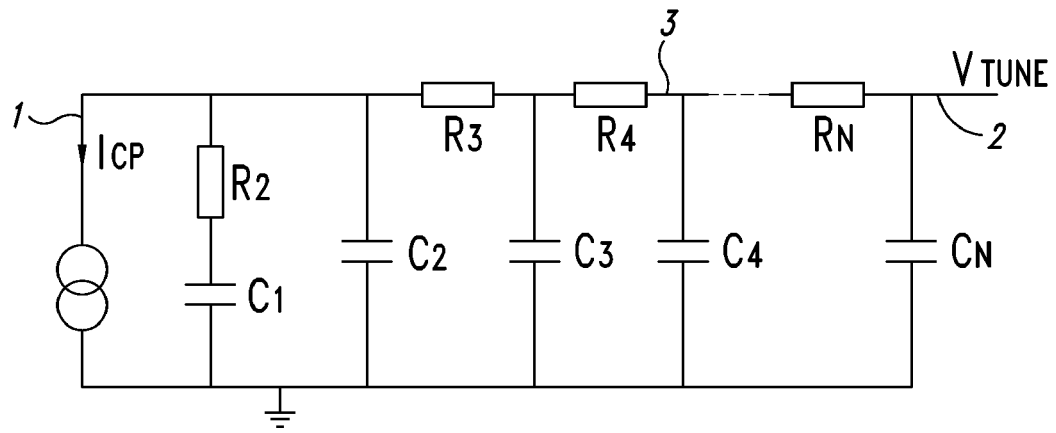
FIG. 2 shows another loop filter structure of N-th order according to another approach that has been used.

In the loop filter structure according to FIG. 3, the cascade arrangement of RC-sections as described above is coupled between the nodes 1 and 2 such that the circuit with capacitor $C_1$ and resistor $R_2$ for generating a zero is coupled to the node 1 through the other circuits for generating the poles, i.e., the structure as shown according to FIG. 2 is reversed. The transfer function $V_{TUNE}/I_{CP}$ of the loop filter according to FIG. 3 is unchanged with respect to the corresponding transfer function of the loop filter according to FIG. 2, but the noise contribution of resistors $R_3, \ldots, R_N$ to the PLL phase noise is reduced significantly. Hence, the loop filter can be made more high ohmic which helps for IC integration as the capacitors for generating the poles can be made smaller. Furthermore, the limitation due to the VCO input capacitance is relaxed, because usually $C_N \ll C_2$.

Making the poles more high ohmic by reducing $C_3, \ldots, C_N$ and increasing in proportion at the same time the resistors $R_3, \ldots, R_N$ even further reduces their noise contribution, which is in contrast to the structure as shown in FIG. 2 with respect to the prior approach that has been used. However, in this case the increased voltage drop across these resistors during the pull-in transient can lead to earlier saturation in the charge pump current sources for providing the input current signal $I_{CP}$, which increases the lock time or settling time of the loop filter.

Figure 4:
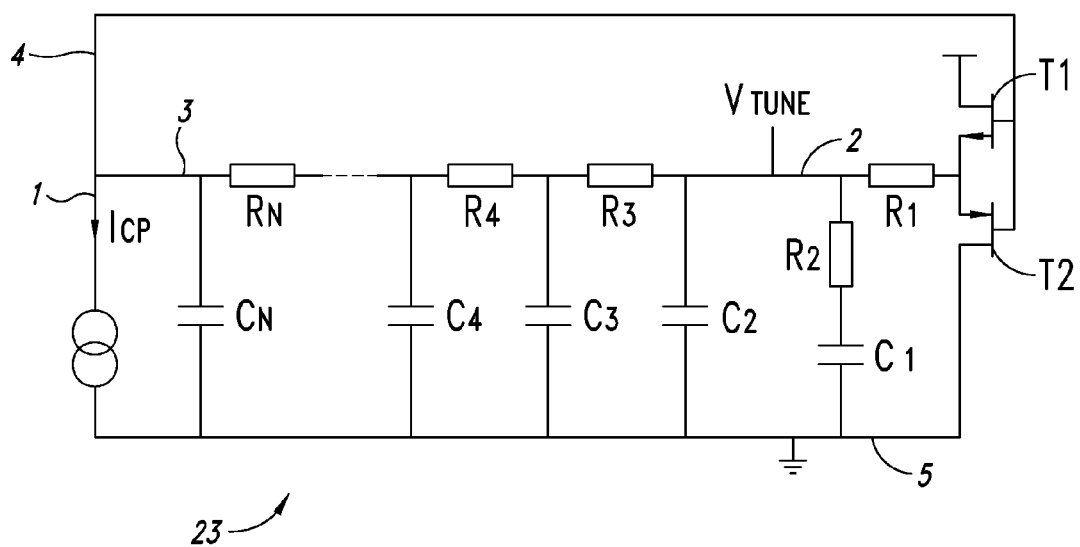
FIG. 4 shows another embodiment of a loop filter.

In FIG. 4 there is shown an embodiment of a loop filter which may serve to reduce the lock time of the loop filter during the pull-in transient. Particularly, in addition to the circuit as shown in FIG. 3, the loop filter according to FIG. 4 includes a transistor circuit having a first transistor T1 and a second transistor T2 coupled to a second signal path 4 which is coupled in parallel to the first signal path 3 at the node 1. As shown in FIG. 4, the second signal path 4 is coupled to the node 2 through the transistor circuit that includes transistors T1 and T2 and, in this embodiment, resistor R1.

In the following description, the base and gate nodes of bipolar or MOS transistors are generally referred to as control nodes, whereas the emitter-collector paths and drain-source paths are generally referred to as controlled paths of the respective transistor.

According to FIG. 4 the control node of the first transistor T1 is coupled to the second signal path 4 and the controlled path of the transistor T1 is coupled to the second node 2, in the present embodiment through a resistor $R_1$ coupled between the transistor circuit and the node 2. One end of the controlled path of transistor T1 is coupled to the resistor $R_1$ and the other end of the controlled path is coupled to ground. The second transistor T2 is coupled with its control node to the signal path 4, whereas the controlled path of the transistor T2 is coupled to the second node 2 through resistor $R_1$. The other end of the controlled path of transistor T2 is coupled to reference node 5. The transistors T1 and T2 are of opposite conductive types and may be, in principle, MOS type transistors or bipolar type transistors.

The transistor circuit comprising transistors T1 and T2 may be seen as a kind of complementary transistor clamp circuit in order to avoid an increased lock time of the loop filter due to saturation of the charge pump current sources providing the input current $I_{CP}$. The transistor circuit helps not only to limit the voltage drop across resistors $R_3, \ldots, R_N$ to $+/-1V_{TH}$ (when MOS transistors are used) or $+/-1V_{BE}$ (if bipolar transistors are used) (with $V_{TH}$ being the threshold voltage of a MOS transistor and $V_{BE}$ being the basis-emitter-voltage of a bipolar transistor), but also to break the slew rate limitation during the pull-in transient. By means of the second signal path 4 coupled in parallel to the first signal path 3 a pull-in transient current from the charge pump can be supplied more or less directly to the largest capacitor $C_1$ so that the voltage drop across the resistors $R_3, \ldots, R_N$ during the pull-in transient does not increase the lock time since the current for charging capacitor $C_1$ is bypassed through signal path 4 to the node 2 and even amplified by the transistors T1, T2.

If, for example, $I_{CP}=100\,\mu A$, $R_1=0$, $R_3+\ldots+R_N=20\,k\text{Ohm}$, then a transistor circuit with bipolar transistors (assuming $V_{BE}=0.7V$, $\beta=100$ with $\beta$ being the amplification factor) would increase the peak current at which the integrator $C_1$ is charged during the pull-in transient from 100 $\mu$A to 6.5 mA. The resistor $R_1$ can be used to stabilize the current increase. The dead zone (or switch-on voltage) of the transistor circuit due to the two $V_{TH}$ (or $V_{BE}$) helps to avoid side effects when the PLL is locked, if $I_{CP}$ and $R_3, \ldots, R_N$ are dimensioned such that the peak voltage across $R_3, \ldots, R_N$ is much smaller than $V_{TH}$ (or $V_{BE}$) when the PLL is locked. Usually, there is no degradation of the loop stability due to the current increase, because charge pump PLLs tend to become more stable at increased charge pump current.

Figure 5:
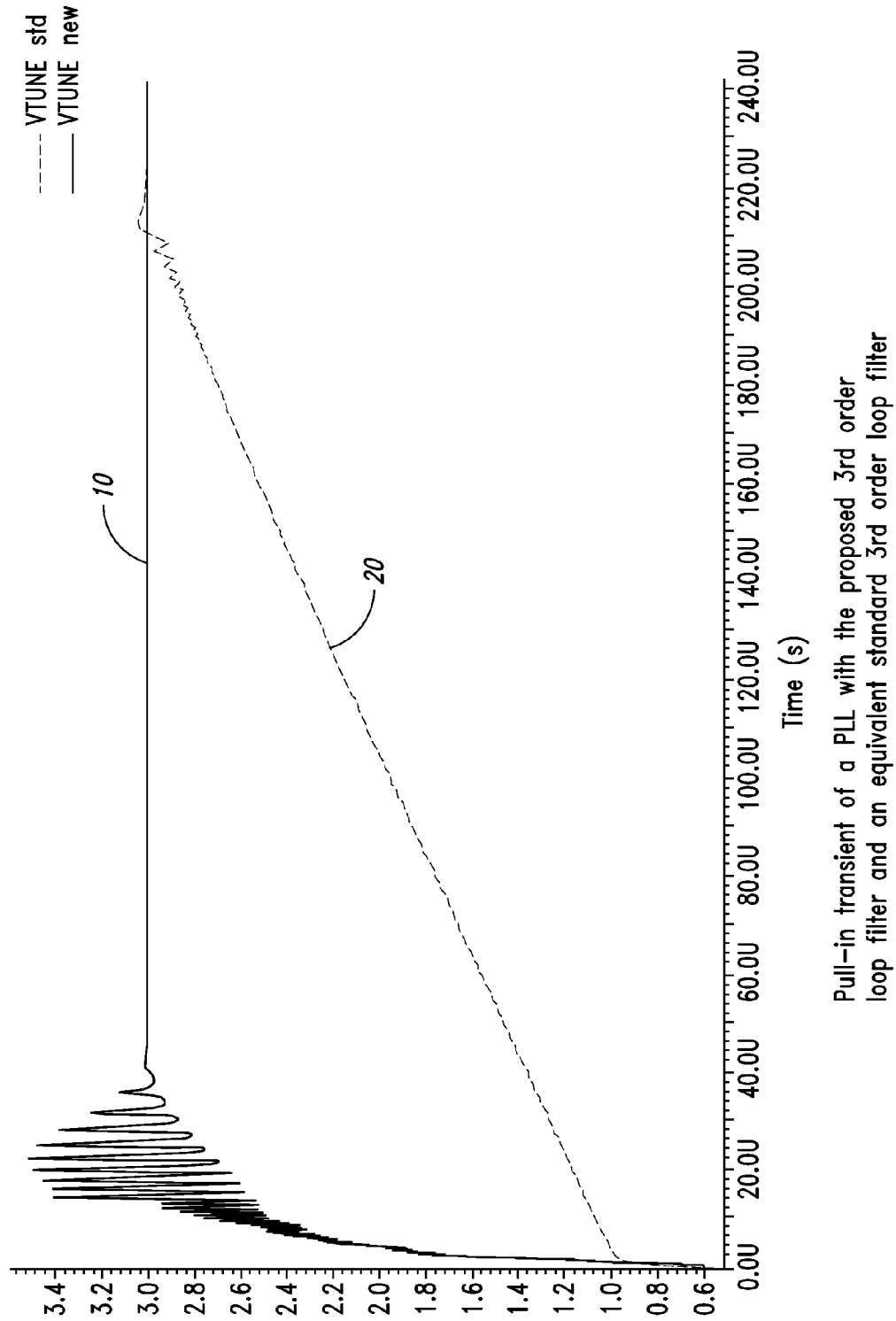
FIG. 5 shows an exemplary signal diagram of a pull-in transient behavior of a PLL with a third order loop filter structure according to an embodiment of the disclosure vs. an equivalent standard third order loop filter.

For example, in an implementation of a sigma-delta-PLL with a third order loop filter according to the improved structure as described above, a five times reduced worst case lock time, which was in the prior approach shown in FIG. 2 dominated by the slew rate limitation during the pull-in transient, could be achieved. In this regard, FIG. 5 shows an exemplary signal diagram for a lock transient of a PLL with a third order loop filter according to the principles as shown in FIG. 4 vs. an equivalent standard third order loop filter. In FIG. 5 the curve designated with reference numeral 10 shows the output voltage signal $V_{TUNE}$ in accordance with the embodiment of FIG. 4, whereas the curve designated with reference numeral 20 shows the output voltage signal $V_{TUNE}$ for an equivalent standard third order loop filter over time. As it is shown in FIG. 5, according to the embodiment of the present disclosure the lock time until the steady state of the output voltage $V_{TUNE}$ is reached is reduced significantly compared to the equivalent standard third order loop filter.

With the structure according to FIG. 4, at the same time the phase noise of the PLL was improved considerably. Further, a higher integration level of a PLL may be reached with a loop filter in accordance with the present disclosure with only one external component (capacitor $C_1$).

Figure 6:
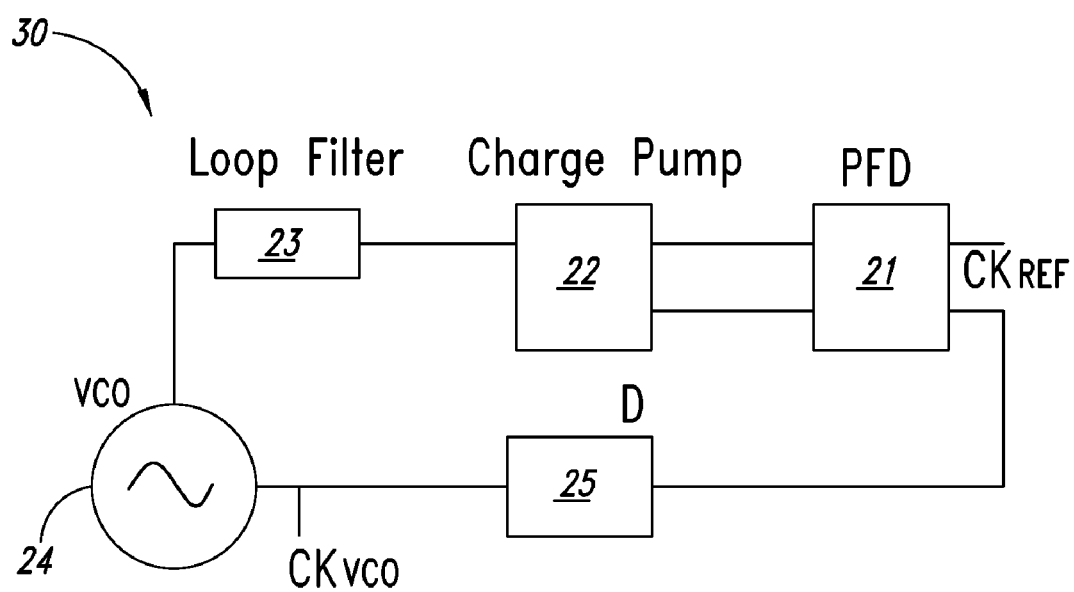
FIG. 6 shows an embodiment of a phase locked loop employing a loop filter.

FIG. 6 shows a block diagram depicting an exemplary PLL circuit which implements a loop filter according to the disclosure. The exemplary phase locked loop 30 includes a phase-frequency detector (PFD) 21, a charge pump 22, a loop filter 23 (for example, implemented as shown in FIG. 3 or 4), a voltage controlled oscillator (VCO) 24, and a divider (D) 25, which provides an output signal which is lower in frequency (determined by the divider factor) than the VCO output signal.

The phase-frequency detector 21 receives the divided VCO output signal from the divider 25 at one input terminal and compares the phase and frequency to a reference signal $CK_{REF}$ received at the other input terminal. Based on the comparison of these signals, the PFD 21 generates control signals to the charge pump 22, which generates a control signal (e.g., a current signal $I_{CP}$) that is low-pass filtered by the loop filter 23, which may be implemented, for example, as shown in FIG. 3 or FIG. 4. The output signal of the loop filter (such as $V_{TUNE}$) is provided to the VCO 24, which tunes the frequency of the VCO accordingly. The VCO 24 generates an output clock signal $CK_{VCO}$, which is divided down by the divider 25 for comparison at the PFD 21 to adjust to the same phase and frequency.

While this detailed description has set forth some embodiments of the present disclosure, the appended claims cover also other embodiments of the disclosure which may differ from the described embodiments according to various modifications. It is to be understood that the above description is intended to be illustrative and not restrictive. Moreover, in this disclosure the terms "first", "second", and "third", etc. are used merely as labels, and are not intended to impose numerical requirements on their objects. Other embodiments and modifications within the scope of the claims will be apparent to those of skill in the art upon studying the above description in connection with the drawings. The scope of the disclosure should, therefore, be determined with reference to the appended claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A loop filter, comprising
   a first node configured to receive an input signal to the loop filter, and a second node configured to provide an output signal of the loop filter;
   a first signal path between the first and second nodes, the first signal path including a cascade arrangement coupled between the first node and the second node, the cascade arrangement including:
      a first circuit having a first capacitor proximate to the second node and configured to generate a zero;
      a second circuit having a second capacitor proximate to the second node and configured to generate a first pole; and
      a third circuit between the second circuit and the first node and configured to generate a second pole, the third circuit having a third capacitor, the first capacitor having a first capacitance that is greater than a capacitance of the second and third capacitors.

2. The loop filter of claim 1 wherein the first circuit has an impedance that is lower than an impedance of the second circuit and an impedance of the third circuit.

3. The loop filter of claim 1 wherein the first circuit for generating a zero includes at least a first resistor coupled to the first capacitor.

4. The loop filter of claim 3 wherein the first resistor and first capacitor are coupled in series between the second node and a reference node.

5. The loop filter of claim 3 wherein the second circuit includes the first resistor coupled to the second capacitor, and the third circuit includes at least a second resistor and the third capacitor, with the third capacitor coupled to a reference node and the second resistor coupled between the second circuit and the first node.

6. The loop filter of claim 1, further including:
   an n-th circuit structured to generate an additional pole coupled to the first node in the first signal path and including at least an n-th resistor and an n-th capacitor, with the n-th capacitor coupled between the first node and a reference node and the n-th resistor coupled between the third circuit and the first node.

7. The loop filter of claim 1 wherein the second and third circuits are configured such that an input impedance of the second pole is higher than an output impedance of the first pole.

8. The loop filter of claim 1, further including at least one transistor circuit that includes at least a first transistor having a control node and a controlled path, with the control node of the first transistor coupled to the first node and the controlled path of the first transistor coupled to the second node to form a second signal path that is in parallel to the first signal path.

9. The loop filter of claim 8 wherein the at least one transistor circuit includes at least a second transistor having a control node and a controlled path, with the control node of the second transistor coupled to the first node and the controlled path of the second transistor coupled to the second node, wherein the first and second transistors are of opposite conductive types.

10. The loop filter of claim 1, further comprising:
    a transistor circuit coupled to the second node; and
    a resistor coupled between the transistor circuit and the second node.

11. A loop filter, comprising:
    a first node configured to receive an input signal to the loop filter, and a second node configured to provide an output signal of the loop filter;
    a first signal path between the first and second nodes that includes a passive filter of at least 3rd order coupled between the first node and the second node, the passive filter including:
       a first circuit between the second node and a reference node and configured to generate a zero, the first circuit having at least a first resistor coupled in series with a first capacitor having a first capacitance;
       a second circuit configured to generate a first pole and having a second capacitor coupled to the second node and the reference node; and
       a third circuit between the second circuit and the first node and configured to generate a second pole, the third circuit having a third capacitor coupled between the second circuit and the reference node, and further including a second resistor between the second circuit and the first node, the second and third capacitors each having a capacitance that is less than a capacitance of the first capacitor; and
    at least one transistor circuit coupled to the first node and the second node to constitute a second signal path in parallel to the first signal path.

12. The loop filter of claim 11, further comprising a third resistor coupled between the second node and the at least one transistor circuit.

13. The loop filter of claim 12 wherein the at least one transistor circuit includes a pair of transistors, each transistor having a gate terminal coupled to the first node and a conduction terminal coupled to the third resistor.

14. A circuit, comprising:
    a loop filter that includes:
       a first node configured to receive an input signal to the loop filter and a second node configured to provide an output signal of the loop filter;
       a first resistor and first capacitor series coupled between the second node and a reference node and configured to generate a zero;
       a first circuit configured to generate a first pole, the first circuit including a second capacitor coupled between the second node and the reference node;
       a second circuit configured to generate a second pole, the second circuit including a third capacitor and including a second resistor having a first terminal connected directly to the second node and having a second terminal; and
       a third circuit between the second circuit and the first node and configured to generate a third pole and having a third resistor and a fourth capacitor with a first terminal of the fourth capacitor connected directly to the third resistor and with a second terminal connected directly to the reference node, the second, third, and fourth capacitors each having a capacitance that is less than a capacitance of the first capacitor.

15. The circuit of claim 14, comprising a fourth resistor, which has a first terminal coupled to the second node, and at least one transistor circuit having first and second transistors, each transistor having a gate terminal coupled to the first node and a conduction terminal coupled to a second terminal of the fourth resistor, and a first one of the two transistors having a second conduction terminal coupled to a voltage source and the other one of the pair of transistors having a second conduction terminal coupled to the reference node.

16. The circuit of claim 15, further including:
a voltage controlled oscillator having an input node coupled to the second node of the loop filter and having an output node;
a divider circuit having an input node coupled to the output node of the voltage controlled oscillator and having an output node;
a phase detector circuit having an input node coupled to the output node of the divider circuit and having two output nodes; and
a charge pump having first and second input nodes coupled to the first and second output nodes of the phase detector circuit and an output node coupled to the first node of the loop filter.

17. A phase-locked loop, comprising:
a phase detector;
a charge pump;
a voltage controlled oscillator; and
a loop filter that includes:
a first node to provide an input signal to the loop filter, and a second node to provide an output signal of the loop filter;
a first signal path between the first and second nodes, the first signal path having a cascade arrangement coupled between the first and second nodes, the cascade arrangement including:
a first circuit having a first capacitor connected next to the second node and configured to generate a zero;
a second circuit having a second capacitor connected next to the second node and configured to generate a first pole; and
a third circuit having a third capacitor connected after the second circuit to be closer to the first node than the second circuit and configured to generate a second pole, the second and third capacitors each having a capacitance that is less than a capacitance of the first capacitor.

18. The phase-locked loop of claim 17, further comprising at least one transistor circuit coupled to the first node and the second node and configured to constitute a second signal path in parallel to the first signal path, and the at least one transistor circuit including a pair of transistors, each transistor having a gate terminal coupled to the first node and a conduction terminal coupled to the second node via a first resistor.

19. The phase-locked loop of claim 18 wherein the first circuit includes at least a second resistor and the first capacitor coupled in series between the second node and a reference node, and the second circuit includes at least the second capacitor coupled between the second node and the reference node, and the third circuit includes a third resistor having a first terminal coupled to the second node and a second terminal, coupled to a first terminal of the third capacitor, the third capacitor further having a second terminal coupled to the reference node.

20. A loop filter, comprising:
a first node configured to receive an input signal to the loop filter, and a second node configured to provide an output signal of the loop filter;
a cascade arrangement coupled between the first node and the second node to form a first signal path, the cascade arrangement including:
a first circuit having a first capacitor coupled to the second node and configured to generate a zero;
a second circuit having a second capacitor coupled to the second node and configured to generate a first pole; and
a third circuit having a third capacitor coupled to the second circuit and configured to generate a second pole;
at least one transistor circuit coupled to the first node and to the second node to form a second signal path in parallel to the first signal path, the transistor circuit including at least a first transistor having a control node and a controlled path, with the control node of the first transistor coupled to the first node and the controlled path of the first transistor coupled to the second node.

21. The loop filter of claim 20, further including an n-th circuit structured to generate an additional pole coupled to the first node and including at least an n-th resistor and an n-th capacitor, with the n-th capacitor coupled between the first node and a reference node and the n-th resistor coupled between the third circuit and the first node.

22. The loop filter of claim 20, wherein the second and third circuits are configured such that an input impedance of the second pole is higher than an output impedance of the first pole.

23. The loop filter of claim 20, wherein the first circuit includes a first resistor and the first capacitor coupled in series between the second node and a reference node, and the third circuit includes a second resistor coupled between the second node and the third capacitor, and further comprising a fourth circuit having a third resistor coupled between the first node and the third circuit and a fourth capacitor coupled between the third resistor and the reference node.

24. A loop filter, comprising:
a first node configured to receive an input signal to the loop filter, and a second node configured to provide an output signal of the loop filter;
a cascade arrangement coupled between the first and second nodes as a first signal path that includes a passive filter of at least 3rd order, the cascade arrangement including:
a first circuit configured to generate a zero and having at least a first resistor and a first capacitor coupled in series between the second node and a reference node;
a second circuit coupled to the second node and having at least a second capacitor coupled between the second node and the reference node; and
a third circuit coupled to the first node and having a second resistor and a third capacitor, with the third capacitor coupled to the first node and the reference node and the second resistor coupled between the second circuit and the first node;
a third resistor coupled to the second node, and
at least one transistor circuit coupled to the first node and coupled to the second node via the third resistor and configured as a second signal path in parallel to the first signal path, the at least one transistor circuit having a pair of transistors, each transistor having a gate terminal coupled to the first node and a conduction terminal coupled to the third resistor.

25. The loop filter of claim 24, wherein the second and third circuits are configured such that an input impedance of the second pole is higher than an output impedance of the first pole.

26. A circuit, comprising:
a loop filter, the loop filter including:
- a first node configured to receive an input signal to the loop filter, a second node configured to conduct an output signal of the loop filter, and a reference node;
- a first resistor and first capacitor series coupled between the second node and the reference node and configured to generate a zero;
- a first circuit configured to generate a first pole, the first circuit having a second capacitor that includes a first terminal coupled to the first resistor and to the second node and a second terminal coupled to the reference node;
- a second circuit configured to generate a second pole, the second circuit having a third capacitor and having a second resistor with a first terminal coupled to the second node and a second terminal coupled to the third capacitor;
- a third circuit having a fourth capacitor and a third resistor, the fourth capacitor having a first terminal coupled to the first node, and a second terminal coupled to the reference node, and the third resistor coupled between the second resistor and the first node;
- a fourth resistor having a first terminal coupled to the second node and having a second terminal; and
- at least one transistor circuit having first and second transistors, each transistor having a gate terminal coupled to the first node and a conduction terminal coupled to the second terminal of the fourth resistor, and a first one of the two transistors having a second conduction terminal coupled to a voltage source and the other one of the pair of transistors having a second conduction terminal coupled to the reference node.

27. The loop filter of claim 26, wherein the second and third circuits are configured such that an input impedance of the second pole is higher than an output impedance of the first pole.

28. The loop filter of claim 26, further including:
- a voltage controlled oscillator having an input node coupled to the second node of the loop filter and having an output node;
- a divider circuit having an input node coupled to the output node of the voltage controlled oscillator and having an output node;
- a phase detector circuit having an input node coupled to the output node of the divider circuit and having two output nodes; and
- a charge pump having first and second input nodes coupled to the first and second output nodes of the phase detector circuit and an output node coupled to the first node of the loop filter.

29. A phase-locked loop, comprising:
a phase detector;
a charge pump;
a voltage controlled oscillator, and
a loop filter that includes:
- a first node configured to receive an input signal to the loop filter and a second node configure to conduct an output signal of the loop filter;
- a cascade arrangement coupled between the first node and the second node to form a first signal path that includes at least a first circuit coupled to the second node and configured to generate a zero, a second circuit coupled to the second node and configured to generate a first pole, and a third circuit coupled to the second circuit and the first node and configured to generate a second pole;
- a first resistor having a first terminal coupled to the second node, and having a second terminal; and
- at least one transistor circuit coupled to the first node and the second node to form a second signal path in parallel to the first signal path, the at least one transistor circuit including a pair of transistors, each transistor having a gate terminal coupled to the second node and a conduction terminal coupled to the second terminal of the first resistor.

30. The circuit of claim 29, wherein the voltage controlled oscillator has an input node coupled to the second node of the loop filter and has an output node, the divider circuit has an input node coupled to the output node of the voltage controlled oscillator and has an output node, the phase detector circuit has an input node coupled to the output node of the divider circuit and has two output nodes, and the charge pump has first and second input nodes coupled to the first and second output nodes of the phase detector circuit and an output node coupled to the first node of the loop filter.

31. The loop filter of claim 29, wherein the second and third circuits are configured such that an input impedance of the second pole is higher than an output impedance of the first pole.

* * * * *